United States Patent
Suzuki

(10) Patent No.: US 9,520,905 B2
(45) Date of Patent: Dec. 13, 2016

(54) IMPEDANCE MATCHING APPARATUS AND METHOD, AND COMPUTER PROGRAM

(75) Inventor: Masami Suzuki, Kawasaki (JP)

(73) Assignee: PIONEER CORPORATION, Kanagawa (JP)

( * ) Notice: Subject to any disclaimer, the term of this patent is extended or adjusted under 35 U.S.C. 154(b) by 98 days.

(21) Appl. No.: 14/425,938

(22) PCT Filed: Sep. 4, 2012

(86) PCT No.: PCT/JP2012/072473
§ 371 (c)(1),
(2), (4) Date: Mar. 20, 2015

(87) PCT Pub. No.: WO2014/037994
PCT Pub. Date: Mar. 13, 2014

(65) Prior Publication Data
US 2015/0236728 A1    Aug. 20, 2015

(51) Int. Cl.
*H03C 1/52*   (2006.01)
*H04B 1/04*   (2006.01)
*H04B 5/00*   (2006.01)

(52) U.S. Cl.
CPC .......... *H04B 1/0458* (2013.01); *H04B 5/0037* (2013.01); *H04B 5/0081* (2013.01)

(58) Field of Classification Search
None
See application file for complete search history.

(56) References Cited

U.S. PATENT DOCUMENTS

| 4,951,009 A | * | 8/1990 | Collins | G01R 33/3628 333/17.3 |
| 5,629,653 A | * | 5/1997 | Stimson | H03H 7/40 333/17.3 |
| 2003/0184319 A1 | | 10/2003 | Nishimori et al. | |
| 2010/0315280 A1 | * | 12/2010 | Bakhtar | G01S 13/02 342/22 |

(Continued)

FOREIGN PATENT DOCUMENTS

JP    09-134800    5/1997
JP    2001-274651   10/2001

(Continued)

OTHER PUBLICATIONS

International Search Report PCT/JP2012/072473 dated Dec. 11, 2012.

*Primary Examiner* — Lana N Le
(74) *Attorney, Agent, or Firm* — Young & Thompson

(57) ABSTRACT

A impedance matching apparatus (100) is provided with: a matching circuit (110) having a plurality of variable reactance elements; an incident signal/reflected signal extracting circuit (120) configured to extract an incident signal and a reflected signal; an estimating device (130) configured to estimate input impedance of a transmitting antenna (11) on the basis of the extracted incident signal and the extracted reflected signal; and a setting device (140) configured to set a value associated with one part of the plurality of variable reactance elements such that output impedance of a power supply (14) theoretically matches the input impedance on the basis of the estimated input impedance, and then adjust a value associated with at least one of the plurality of variable reactance elements according to the extracted reflected signal.

9 Claims, 9 Drawing Sheets

(56) References Cited

U.S. PATENT DOCUMENTS

| | | | | |
|---|---|---|---|---|
| 2011/0086600 A1* | 4/2011 | Muhammad | H04B 1/0458 | 455/120 |
| 2014/0107638 A1* | 4/2014 | Hancock | A61B 18/18 | 606/33 |
| 2015/0109176 A1* | 4/2015 | Wan | H01Q 7/005 | 343/750 |
| 2016/0182003 A1* | 6/2016 | Teshima | H04B 1/3827 | 455/73 |

FOREIGN PATENT DOCUMENTS

| | | |
|---|---|---|
| JP | 2003-318636 | 11/2003 |
| JP | 2004-085446 | 3/2004 |
| JP | 2010-041558 | 2/2010 |
| JP | 4856288 | 1/2012 |
| WO | 2004040693 | 5/2004 |

* cited by examiner

Load resistance: 22 Ω
Time to matching: 1. 0 sec

Load resistance: 22 Ω
Time to matching: 3. 2 sec

Load resistance: 220 Ω
Time to matching: 3. 4 sec

Load resistance: 220 Ω
Time to matching: 7. 8 sec

IMPEDANCE MATCHING APPARATUS AND METHOD, AND COMPUTER PROGRAM

TECHNICAL FIELD

The present invention relates to an impedance matching apparatus and method which performs impedance matching associated with an electrical signal path, and a computer program.

BACKGROUND ART

As this type of apparatus, for example, there is proposed an apparatus configured to detect resistance and conductance of a transmission line and to adjust an impedance variable element on the basis of the detected resistance and conductance (refer to Patent Literature 1). Alternatively, there is proposed an apparatus configured to perform the impedance matching by iteration using a recursive method such as a steepest descent method (refer to Patent Literatures 2 and 3).

CITATION LIST

Patent Literature

Patent Literature 1: Japanese Patent Application Laid Open No. 2001-274651
Patent Literature 2: Japanese Patent Application Laid Open No. 2003-318636
Patent Literature 3: International Publication No. 2004/040693

SUMMARY OF INVENTION

Technical Problem

In the technology disclosed in the Patent Literature 1, there is such a technical problem that it takes a relatively long time for the impedance matching because values of a variable inductor and a variable capacitor as the impedance variable element are adjusted, for example, along a constant resistance circle, a constant reactance circle, a constant conductance circle, a constant susceptance circle or the like on a circular chart which represents complex impedance (so-called Smith chart). Moreover, an actual apparatus is influenced, for example, by parasitic capacitance between wiring patterns of an electrical circuit, inductance components of the wiring patterns, or the like. There is therefore a possibility that the impedance matching cannot be appropriately performed, which is technically problematic.

In the technology disclosed in the Patent Literatures 2 and 3, there is such a technical problem that the time required for the impedance matching varies depending on how to select an initial value(s).

It is therefore an object of the present invention to provide an impedance matching apparatus and method, and a computer program, by which the impedance matching can be appropriately performed in a short time even if there is the influence caused by the wiring patterns.

Solution to Problem

The above object of the present invention can be achieved by an impedance matching apparatus configured to perform impedance matching between input impedance of a transmitting antenna of a transmission circuit, which comprises the transmitting antenna and a power supply configured to supply electric power to the transmitting antenna, and output impedance of the power supply, said impedance matching apparatus is provided with: a matching circuit electrically disposed between the power supply and the transmitting antenna and having a plurality of variable reactance elements; an incident signal/reflected signal extracting circuit electrically disposed between the power supply and said matching circuit, and configured to extract an incident signal, which is electric power transmitted from the power supply to the transmitting antenna, and a reflected signal, which is electric power transmitted from the transmitting antenna to the power supply; an estimating device configured to estimate the input impedance on the basis of the extracted incident signal and the extracted reflected signal; and a setting device configured to set a value associated with one part of the plurality of variable reactance elements such that the output impedance theoretically matches the input impedance on the basis of the estimated input impedance, and then adjust a value associated with at least one of the plurality of variable reactance elements according to the extracted reflected signal.

The above object of the present invention can be achieved by an impedance matching method of performing impedance matching between input impedance of a transmitting antenna and output impedance of a power supply, on an impedance matching apparatus disposed on a transmission circuit which comprises the transmitting antenna and the power supply configured to supply electric power to the transmitting antenna, said impedance matching apparatus is provided with: a matching circuit electrically disposed between the power supply and the transmitting antenna and having a plurality of variable reactance elements; and an incident signal/reflected signal extracting circuit electrically disposed between the power supply and said matching circuit, and configured to extract an incident signal, which is electric power transmitted from the power supply to the transmitting antenna, and a reflected signal, which is electric power transmitted from the transmitting antenna to the power supply, said impedance matching method is provided with: an estimating process of estimating the input impedance on the basis of the extracted incident signal and the extracted reflected signal; and a setting process of setting a value associated with one part of the plurality of variable reactance elements such that the output impedance theoretically matches the input impedance on the basis of the estimated input impedance, and then adjusting a value associated with at least one of the plurality of variable reactance elements according to the extracted reflected signal.

The above object of the present invention can be achieved by a computer program configured to make a computer provided in an impedance matching apparatus function as an estimating device and a setting device, said impedance matching apparatus being disposed on a transmission circuit which comprises a transmitting antenna and a power supply configured to supply electric power to the transmitting antenna, said impedance matching apparatus is provided with: a matching circuit electrically disposed between the power supply and the transmitting antenna and having a plurality of variable reactance elements; and an incident signal/reflected signal extracting circuit electrically disposed between the power supply and said matching circuit, and configured to extract an incident signal, which is electric power transmitted from the power supply to the transmitting antenna, and a reflected signal, which is electric power transmitted from the transmitting antenna to the power supply, said estimating device being configured to estimate the input impedance on the basis of the extracted incident signal and the extracted reflected signal, and said setting device being configured to set a value associated with one part of the plurality of variable reactance elements such that the output impedance theoretically matches the input impedance on the basis of the estimated input impedance, and then adjust a value associated with at least one of the plurality of variable reactance elements according to the extracted reflected signal.

The operation and other advantages of the present invention will become more apparent from embodiments and examples explained below.

DESCRIPTION OF EMBODIMENTS

Figure 1:
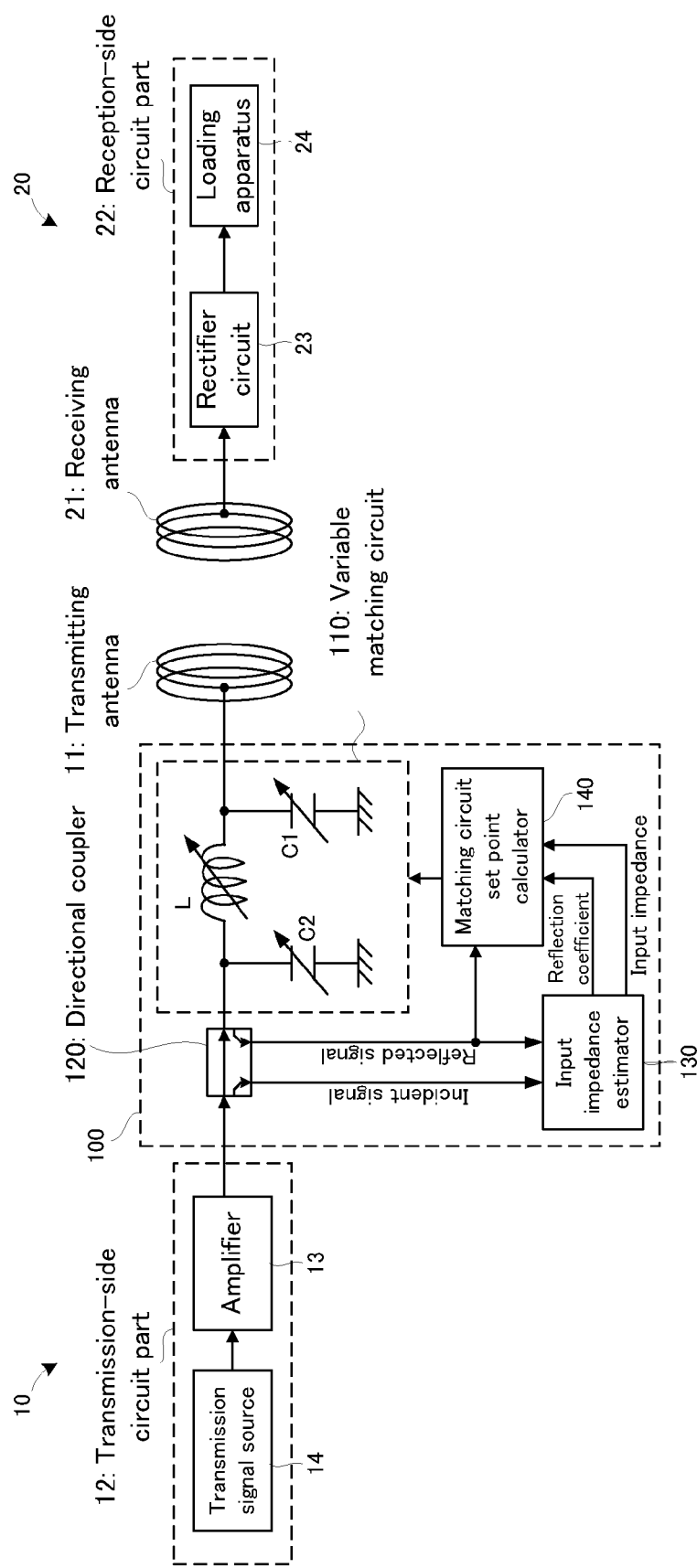
FIG. 1 is a block diagram illustrating a configuration of an impedance matching apparatus in a first example.

Hereinafter, respective embodiments of the impedance matching apparatus and method, and computer program of the present invention of the present invention will be explained.
(Impedance Matching Apparatus)

An impedance matching apparatus in an embodiment is an impedance matching apparatus configured to perform impedance matching between input impedance of a transmitting antenna of a transmission circuit, which comprises the transmitting antenna and a power supply configured to supply electric power to the transmitting antenna, and output impedance of the power supply, said impedance matching apparatus is provided with: a matching circuit electrically disposed between the power supply and the transmitting antenna and having a plurality of variable reactance elements; an incident signal/reflected signal extracting circuit electrically disposed between the power supply and said matching circuit, and configured to extract an incident signal, which is electric power transmitted from the power supply to the transmitting antenna, and a reflected signal, which is electric power transmitted from the transmitting antenna to the power supply; an estimating device configured to estimate the input impedance on the basis of the extracted incident signal and the extracted reflected signal; and a setting device configured to set a value associated with one part of the plurality of variable reactance elements such that the output impedance theoretically matches the input impedance on the basis of the estimated input impedance, and then adjust a value associated with at least one of the plurality of variable reactance elements according to the extracted reflected signal.

According to the impedance matching apparatus in the embodiment, the impedance matching apparatus performs the impedance matching between the input impedance of the transmitting antenna of the transmission circuit, which is provided with the transmitting antenna and the power supply configured to supply electric power to the transmitting antenna, and the output impedance of the power supply.

The impedance matching apparatus is provided with the matching circuit, the incident signal/reflected signal extracting circuit, the estimating device and the setting device.

The matching circuit is electrically disposed between the power supply and the transmitting antenna, and has the plurality of variable reactance elements. The expression "electrically disposed between the power supply and the transmitting antenna" means being disposed between the power supply and the transmitting antenna on a channel or passage of electricity (on a circuit diagram), and the matching circuit is not necessarily between the power supply and the transmitting antenna in physical arrangement.

The incident signal/reflected signal extracting circuit is electrically disposed between the power supply and the matching circuit, and extracts the incident signal, which is electric power transmitted from the power supply to the transmitting antenna, and the reflected signal, which is electric power transmitted from the transmitting antenna to the power supply. The incident signal/reflected signal extracting circuit is specifically, for example, a directional coupler, a circuit provided with a circulator and an attenuator, or the like.

The estimating device, which is provided, for example, with a memory, a processor and the like, estimates the input impedance of the transmitting antenna on the basis of the incident signal and the reflected signal extracted by the incident signal/reflected signal extracting circuit. Various known aspects can be applied to the estimation of the input impedance. As a specific example, the input impedance is estimated from an amplitude ratio, a phase difference or the like between the incident signal and the reflected signal.

The setting device, which is provided, for example, with a memory, a processor and the like, firstly sets the value associated with one part of the plurality of variable reactance elements of the matching circuit such that the output impedance of the power supply theoretically matches the input impedance of the transmitting antenna, on the basis of the estimated input impedance. The setting device then adjusts the value associated with at least one of the plurality of variable reactance elements according to the extracted reflected signal.

Here, according to the study of the present inventor, the following matters have been found. In the impedance matching process, namely, for example, the values of a variable inductor and a variable capacitor which constitute the matching circuit are adjusted to change the value of the input impedance along a theoretical circle such as a constant resistance circle and a constant reactance circle on the Smith chart and to move it eventually to a matching point, in many cases. This method, however, likely requires a longer time for the impedance matching.

In addition, an actual apparatus is influenced, for example, by parasitic capacitance between wiring patterns of an electrical circuit, inductance components of the wiring patterns, or the like. There is thus a possibility that an impedance point corresponding to the input impedance is not changed along the theoretical circle on the Smith chart. Moreover, a method using a recursive method such as a steepest descent method likely requires a longer time for the impedance matching, depending on how to select the initial value(s).

In the embodiment, however, as described above, the value associated with one part of the plurality of variable reactance elements of the matching circuit is set such that the output impedance of the power supply theoretically matches the input impedance of the transmitting antenna, on the basis of the estimated input impedance, by the setting device. Then, the value associated with at least one of the plurality of variable reactance elements is adjusted according to the extracted reflected signal, by the setting device.

By setting the value associated with at least one of the plurality of variable reactance elements to theoretically achieve the impedance matching, it is possible to move the impedance point corresponding to the input impedance to near the matching point. Then, the value associated with at least one of the plurality of variable reactance elements is adjusted according to the reflected signal (i.e. in a state including an influence of the parasitic capacitance between the wiring patterns or the like). It is therefore possible to significantly reduce a time required for the adjustment according to the reflected signal.

As a result, according to the impedance matching apparatus in the embodiment, the impedance matching can be appropriately performed in a short time even if there is the influence caused by the wiring patterns of the electrical circuit.

In one aspect of the impedance matching apparatus in the embodiment, said matching circuit has, as the plurality of variable reactance elements, a variable inductor, a first variable capacitor electrically connected to one end of the variable inductor and a second variable capacitor electrically connected to the other end of the variable inductor, and said setting device sets, as the value associated with one part of the plurality of variable reactance elements, a value associated with the variable inductor, a value associated with the first variable capacitor and a value associated with the second variable capacitor such that the output impedance theoretically matches the input impedance, on the basis of the estimated input impedance.

According to this aspect, the matching circuit is a so-called π-type matching circuit having the variable inductor, the first variable capacitor electrically connected to one end of the variable inductor and the second variable capacitor electrically connected to the other end of the variable inductor.

The setting device sets the value associated with the variable inductor, the value associated with the first variable capacitor and the value associated with the second variable capacitor such that the output impedance theoretically matches the input impedance, on the basis of the input impedance estimated by the estimating device. By virtue of such a configuration, it is possible to move the impedance point corresponding to the input impedance to near the matching point on the Smith chart, relatively easily.

In another aspect of the impedance matching apparatus in the embodiment, said setting device adjusts the value associated with at least one of the plurality of variable reactance elements until a magnitude of the extracted reflected signal becomes less than or equal to a first threshold value.

According to this aspect, the impedance matching can be achieved, relatively easily. The "first threshold value" is a value for determining whether or not to continue the adjustment of the value associated with at least one of the plurality of variable reactance elements, and is set as a fixed value in advance, or a variable value according to some physical quantity or parameter.

The "first threshold value" may be set as the magnitude of the reflected signal at which an influence of the reflected signal on the transmission circuit is within an allowable range, for example, on the basis of a relation between the magnitude of the reflected signal and the influence of the reflected signal on the transmission circuit, which is obtained by experiments, experiences, or simulations.

In this aspect, if the magnitude of the extracted reflected signal becomes less than or equal to the first threshold value and then becomes greater than the first threshold value, said setting device adjusts the value associated with at least one of the plurality of variable reactance elements until the magnitude of the extracted reflected signal becomes less than or equal to the first threshold value again.

By virtue of such a configuration, the impedance matching can be appropriately achieved even if impedance mismatching occurs in operation of the transmission circuit, which is extremely useful in practice.

Alternatively, in another aspect of the impedance matching apparatus in the embodiment, said estimating device sequentially estimates a reflection coefficient on the basis of the extracted incident signal and the extracted reflected signal, and said setting device adjusts the value associated with at least one of the plurality of variable reactance elements until a magnitude of the estimated reflection coefficient becomes less than or equal to a second threshold value, instead of the extracted reflected signal.

According to this aspect, the impedance matching can be achieved, relatively easily. The "second threshold value" is a value for determining whether or not to continue the adjustment of the value associated with at least one of the plurality of variable reactance elements, and is set as a fixed value in advance, or a variable value according to some physical quantity or parameter.

The "second threshold value" may be set as the magnitude of the reflection coefficient at which an influence of the reflection coefficient on the transmission circuit is within an allowable range, for example, on the basis of a relation between the magnitude of the reflection coefficient and the influence of the reflection coefficient on the transmission circuit, which is obtained by experiments, experiences, or simulations.

In this aspect, if the magnitude of the extracted reflection coefficient becomes less than or equal to the second threshold value and then becomes greater than the second threshold value, said setting device adjusts the value associated with at least one of the plurality of variable reactance elements until the magnitude of the extracted reflection coefficient becomes less than or equal to the second threshold value again.

By virtue of such a configuration, the impedance matching can be appropriately achieved even if the impedance mismatching occurs in operation of the transmission circuit, which is extremely useful in practice.

In another aspect of the impedance matching apparatus in the embodiment, the transmission circuit is a circuit configured to transmit electric power in a wireless manner to a reception circuit which comprises a receiving antenna opposed to the transmitting antenna, and said setting device adjusts the value associated with at least one of the plurality of variable reactance elements according to the extracted reflected signal when the electric power is transmitted from the transmission circuit to the reception circuit.

According to this aspect, the transmission circuit is configured to transmit electric power in the wireless manner to the reception circuit which is provided with the receiving antenna opposed to the transmitting antenna of the transmission circuit. Here, the following matters have been found from the study of the present invention; namely, if power transmission is performed from the transmission circuit to the reception circuit, the impedance mismatching occurs on the transmission circuit due to a change in value of a load on the reception circuit side such as, for example, a battery.

In the embodiment, however, the value associated with at least one of the plurality of variable reactance elements is adjusted according to the extracted reflected signal by the setting device when the electric power is transmitted from the transmission circuit to the reception circuit. As a result, the impedance matching can be appropriately performed even during the power transmission from the transmission circuit to the reception circuit.

(Impedance Matching Method)

An impedance matching method in an embodiment is an impedance matching method of performing impedance matching between input impedance of a transmitting antenna and output impedance of a power supply, on an impedance matching apparatus disposed on a transmission circuit which comprises the transmitting antenna and the power supply configured to supply electric power to the transmitting antenna, said impedance matching apparatus is provided with: a matching circuit electrically disposed between the power supply and the transmitting antenna and having a plurality of variable reactance elements; and an incident signal/reflected signal extracting circuit electrically disposed between the power supply and said matching circuit, and configured to extract an incident signal, which is electric power transmitted from the power supply to the transmitting antenna, and a reflected signal, which is electric power transmitted from the transmitting antenna to the power supply, said impedance matching method is provided with: an estimating process of estimating the input impedance on the basis of the extracted incident signal and the extracted reflected signal; and a setting process of setting a value associated with one part of the plurality of variable reactance elements such that the output impedance theoretically matches the input impedance on the basis of the estimated input impedance, and then adjusting a value associated with at least one of the plurality of variable reactance elements according to the extracted reflected signal.

According to the impedance matching method in the embodiment, as in the impedance matching apparatus in the embodiment described above, the impedance matching can be appropriately performed in a short time even if there is the influence caused by the wiring patterns of the electrical circuit.

Even the impedance matching method in the embodiment can adopt the same various aspects as those of the impedance matching apparatus in the embodiment described above.

(Computer Program)

A computer program in an embodiment is a computer program configured to make a computer provided in an impedance matching apparatus function as an estimating device and a setting device, said impedance matching apparatus being disposed on a transmission circuit which comprises a transmitting antenna and a power supply configured to supply electric power to the transmitting antenna, said impedance matching apparatus is provided with: a matching circuit electrically disposed between the power supply and the transmitting antenna and having a plurality of variable reactance elements; and an incident signal/reflected signal extracting circuit electrically disposed between the power supply and said matching circuit, and configured to extract an incident signal, which is electric power transmitted from the power supply to the transmitting antenna, and a reflected signal, which is electric power transmitted from the transmitting antenna to the power supply, said estimating device being configured to estimate the input impedance on the basis of the extracted incident signal and the extracted reflected signal, and said setting device being configured to set a value associated with one part of the plurality of variable reactance elements such that the output impedance theoretically matches the input impedance on the basis of the estimated input impedance, and then adjust a value associated with at least one of the plurality of variable reactance elements according to the extracted reflected signal.

According to the computer program of the present invention, the impedance matching apparatus in the embodiment described above can be relatively easily realized as the computer provided in the impedance matching apparatus reads and executes the computer program from a recording medium for storing the computer program, such as a random access memory (RAM), a compact disc read only memory (CD-ROM) and a DVD read only memory (DVD-ROM), or as it executes the computer program after downloading the program through a communication device. By this, as in the impedance matching apparatus in the embodiment described above, the impedance matching can be appropriately performed in a short time even if there is the influence caused by the wiring patterns of the electrical circuit.

EXAMPLES

First Example

A first example of the impedance matching apparatus of the present invention will be explained with reference to FIG. 1 to FIG. 12.

(Configuration of Apparatus)

A configuration of the impedance matching apparatus in the first example will be explained with reference to FIG. 1. FIG. 1 is a block diagram illustrating the configuration of the impedance matching apparatus in the first example.

In FIG. 1, a transmission circuit 10 is provided with a transmitting antenna 11 and a transmission-side circuit part 12. The transmission-side circuit part 12 is provided with an amplifier 13 and a transmission signal source 14. A reception circuit 20 is provided with a receiving antenna 21 and a reception-side circuit part 22. The reception-side circuit part 22 is provided with a rectifier circuit 23 and a loading apparatus 24.

If a signal (electric power) is supplied from the transmission signal source 14 to the transmitting antenna 11 while the transmitting antenna 11 and the receiving antenna 21 are opposed to each other at a predetermined distance, electric power is transmitted in a wireless manner, for example, by electromagnetic resonance or the like, from the transmitting antenna 11 to the receiving antenna 21. In the reception circuit 20, the electric power received via the receiving antenna 21 is supplied to the loading apparatus 24 which is, for example, a battery or the like.

The impedance matching apparatus 100 is provided with a variable matching circuit 110 electrically disposed between the transmitting antenna 11 and the transmission-side circuit part 12, a direction coupler 120 electrically disposed between the variable matching circuit 110 and the transmission-side circuit unit 12, an input impedance estimator 130, and a matching circuit set point calculator 140.

The variable matching circuit 110 is provided with a variable inductor L, a variable capacitor C1 electrically connected to one end of the variable inductor L, and a variable capacitor C2 electrically connected to the other end of the variable inductor L. In other words, the variable matching circuit 110 is a π-type matching circuit. The variable matching circuit 110 is not limited to the π-type matching circuit but can adopt various aspects such as, for example, an L-type, an inverted L-type, and a T-type.

The variable inductor L, and the variable capacitors C1 and C2 are not limited to a variable inductor element and variable capacitor elements, but may be realized, for example, by connecting a plurality of fixed capacitance type inductors and capacitors having values different from each other, electrically in series or in parallel, by using a mechanical relay or a semiconductor relay, or a micro electro mechanical system (MEMS) switch or the like. The variable capacitors C1 and C2 may be configured to rotate a rotating shaft of a variable condenser (or variable capacitor) with a stepping motor or the like to obtain a desired capacitance value.

The directional coupler 120 extracts an incident signal which is a signal transmitted from the transmission-side circuit part 12 to the transmitting antenna 11, and a reflected signal which is a signal transmitted from the transmitting antenna 11 to the transmission-side circuit part 12. Instead of the directional coupler 120, a circuit provided with a circulator and an attenuator, or the like may be used.

The input impedance estimator 130 estimates input impedance of the transmitting antenna 11, on the basis of the incident signal and the reflected signal extracted by the directional coupler 120. The input impedance may be estimated, for example, from an amplitude ratio, a phase difference or the like between the incident signal and the reflected signal.

The matching circuit set point calculator 140 sets a value associated with one part of the variable inductor L and the variable capacitors C1 and C2 which constitute the variable matching circuit 110 such that output impedance theoretically matches the input impedance, on the basis of the estimated input impedance. The matching circuit set point calculator 140 then adjusts a value associated with at least one of the variable inductor L and the variable capacitors C1 and C2, according to the reflected signal extracted by the directional coupler 120.

The input impedance estimator 130 also calculates a complex reflection coefficient on the basis of the incident signal and the reflected signal. The matching circuit set point calculator 140 may be also configured to adjust the value associated with at least one of the variable inductor L and the variable capacitors C1 and C2, according to the calculated complex reflection coefficient, instead of the reflected signal.

The "transmission signal source 14", the "directional coupler 120", the "input impedance estimator 130" and the "matching circuit set point calculator 140" in the example are one example of the "power supply", the "incident signal/reflected signal extraction circuit", the "estimating device" and the "setting device" of the present invention, respectively. The "variable inductor L and the variable capacitors C1 and C2" in the example are one example of the "plurality of variable reactance elements" of the present invention.

(Impedance Matching Process)

Next, an impedance matching process performed on the impedance matching apparatus 100 as configured above will be explained in detail.

Figure 2:
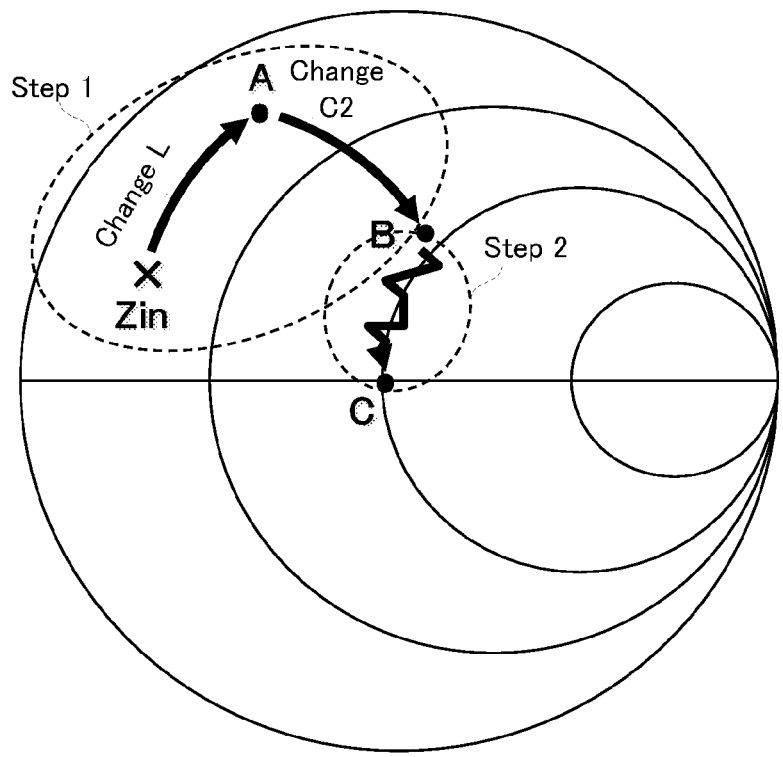
FIG. 2 is a conceptual diagram illustrating a concept of an impedance matching process in the first example.

Firstly, with reference to FIG. 2, a concept of the impedance matching process in the example will be explained. FIG. 2 is a conceptual diagram illustrating the concept of the impedance matching process in the first example. Circles in FIG. 2 indicate the Smith chart.

In the impedance matching process in the example, a step 1 is firstly performed by the matching circuit set point calculator 140, wherein the value associated with one part of the variable inductor L and the variable capacitors C1 and C2 which constitute the variable matching circuit 110 is set such that the output impedance theoretically matches the input impedance, on the basis of the input impedance estimated by the input impedance estimator 130 (refer to "Zin" in FIG. 2) (wherein a value associated with the variable inductor L and a value associated with the variable capacitor C2 are set in FIG. 2).

Then, a step 2 is performed by the matching circuit set point calculator 140, wherein the value associated with at least one of the variable inductor L and the variable capacitors C1 and C2 is adjusted according to the reflected signal extracted by the directional coupler 120. The step 2 is continued until the magnitude of the reflected signal (or a reflection coefficient value if a reflection coefficient is used instead of the reflected signal) becomes less than or equal to a predetermined threshold value.

Next, the step 1 of the impedance matching process will be explained with reference to a flowchart in FIG. 3. Incidentally, it is configured such that the incident signal and the reflected signal are not supplied to the variable matching circuit 110, for example, by a circuit (not illustrated) which bypasses the variable matching circuit 110 or the like, before the start of the step 1. Moreover, electric power weaker than that in a case of the power transmission from the transmitting antenna 11 to the receiving antenna 21 (i.e. electric power weaker than normal rated power) is outputted from the transmission signal source 14 until the impedance matching process ends.

Figure 3:
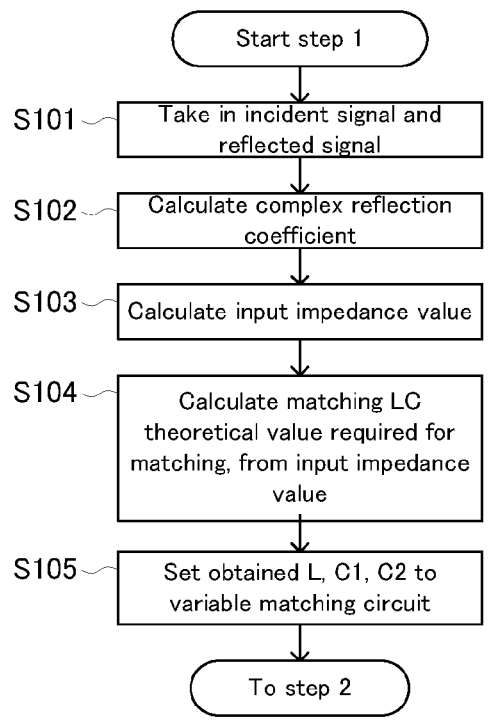
FIG. 3 is a flowchart illustrating a step 1 of the impedance matching process in the first example.

In FIG. 3, firstly, the input impedance estimator 130 obtains the incident signal and the reflected signal extracted by the directional coupler 120 (step S101). The input impedance estimator 130 then calculates the complex reflection coefficient on the basis of the incident signal and the reflected signal obtained (step S102). Since various known aspects can be applied to a method of calculating the complex reflection coefficient, an explanation thereof will be omitted.

The input impedance estimator 130 then calculates the input impedance on the basis of the calculated complex reflection coefficient (step S103). The matching circuit set point calculator 140 then calculates a theoretical value associated with one part of the variable inductor L and the capacitors C1 and C2, which is to match the output impedance with the input impedance, on the basis of the calculated input impedance (step S104).

Then, the matching circuit set point calculator 140 sets the value associated with one part of the variable inductor L and the capacitors C1 and C2 such that it is a value corresponding to the calculated theoretical value (step S105).

Now, the elements of the variable matching circuit 110 in which the theoretical value is calculated in the step S104 described above will be explained.

Figure 4A:
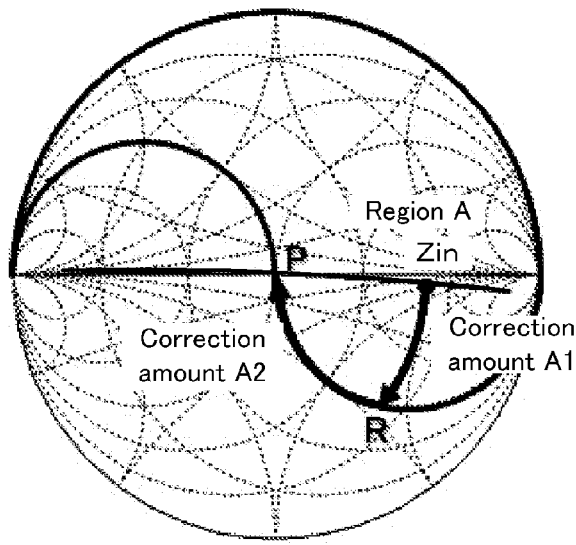
FIG. 4 are diagrams explaining a specific example of the step 1 of the impedance matching process in the first example.
Figure 4B:
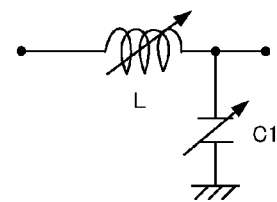

If an impedance point Zin on the Smith chart corresponding to the input impedance calculated in the step S103 described above is included in a region A surrounded by a thick line as illustrated in FIG. 4(a), a theoretical value associated with the variable inductor L and a theoretical value associated with the variable capacitor C1 of the variable matching circuit 110 (refer to FIG. 4(b)) are calculated.

Specifically, for example, firstly, the impedance point Zin is rotated clockwise on the Smith chart to obtain an intersection R between the impedance point Zin and a constant resistance circle with "r=1". Then, a correction amount A1 is obtained, which is required to move the impedance point Zin to the intersection R. Then, a correction amount A2 is obtained, which is required to move the impedance point Zin from the intersection R to a matching point P along the constant resistance circle with "r=1". The obtained correction amounts A1 and A2 are the theoretical value associated with the variable capacitor C1 and the theoretical value associated with the variable inductor L, respectively.

Figure 5A:
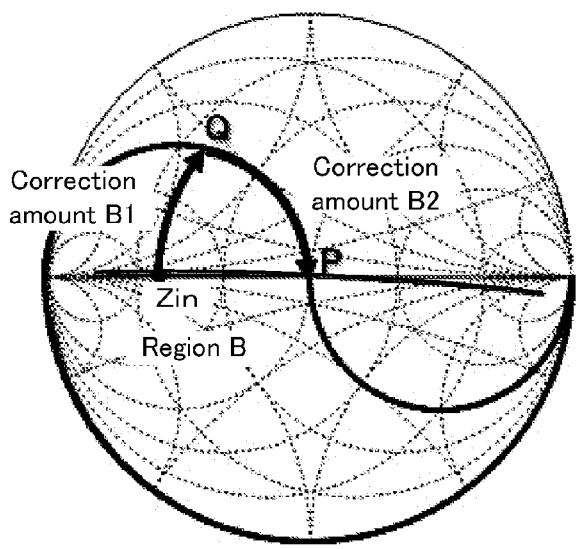
FIG. 5 are diagrams explaining another specific example of the step 1 of the impedance matching process in the first example.
Figure 5B:
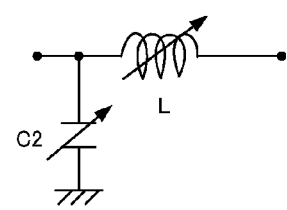

On the other hand, if the impedance point Zin on the Smith chart corresponding to the calculated input impedance is included in a region B surrounded by a thick line as illustrated in FIG. 5(a), a theoretical value associated with the variable inductor L and a theoretical value associated with the variable capacitor C2 of the variable matching circuit 110 (refer to FIG. 5(b)) are calculated.

Specifically, for example, firstly, the impedance point Zin is rotated clockwise on the Smith chart to obtain an intersection Q between the impedance point Zin and a constant conductance circle with "g=1". Then, a correction amount B1 is obtained, which is required to move the impedance point Zin to the intersection Q. Then, a correction amount B2 is obtained, which is required to move the impedance point Zin from the intersection Q to a matching point P along the constant resistance circle with "r=1". The obtained correction amounts B1 and B2 are the theoretical value associated with the variable inductor L and the theoretical value associated with the variable capacitor C1, respectively.

By the way, an actual circuit has, for example, parasitic capacitance between wiring patterns, inductance components of the wiring patterns, or the like, and therefore, the use of only the step 1 of the impedance matching process is not sufficient to match the output impedance with the input impedance in many cases. The step 1, however, allows the impedance point Zin to move to near the matching point on the Smith chart. It is therefore possible to reduce a time required for the step 2, by using a result of the step 1 as an initial value(s) of the step 2 of the impedance matching process described later.

Next, the step 2 of the impedance matching process will be explained with reference to flowcharts in FIG. 6 and FIG. 7. All of threshold values in FIG. 6 and FIG. 7 have the same value.

Figure 6:
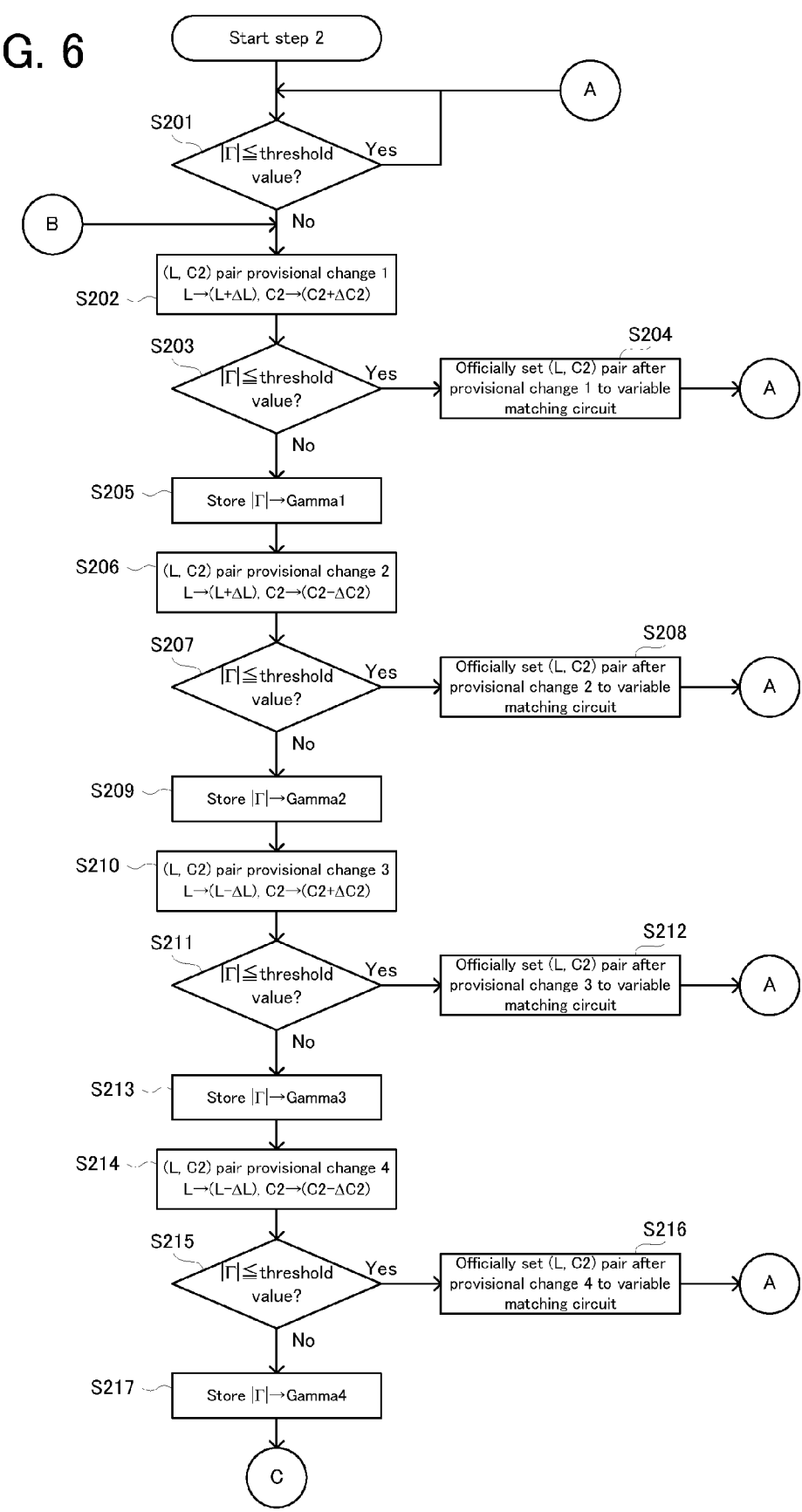
FIG. 6 is a flowchart illustrating a part of a step 2 of the impedance matching process in the first example.

In FIG. 6, firstly, the matching circuit set point calculator 140 determines whether or not an absolute value "|Γ|" of the reflected signal extracted by the directional coupler 120 is less than or equal to the threshold value (step S201). If it is determined that the absolute value of the reflected signal is less than or equal to the threshold value (the step S201: Yes), the matching circuit set point calculator 140 performs the step S201 again.

If it is determined that the absolute value of the reflected signal is greater than the threshold value (the step S201: No), the matching circuit set point calculator 140 provisionally changes the value of the variable inductor L and the value of the variable capacitor C2 to "L+ΔL" and "C2+ΔC2", respectively (step S202). The matching circuit set point calculator 140 then determines whether or not the absolute value of the reflected signal after the provisional change is less than or equal to the threshold value (step S203).

If it is determined that the absolute value of the reflected signal is less than the threshold value (the step S203: Yes), the matching circuit set point calculator 140 officially changes the value of the variable inductor L and the value of the variable capacitor C2 to "L+ΔL" and "C2+ΔC2", respectively (step S204). At this time, the value of the variable capacitor C1 is not changed (i.e. still has an initial value).

If it is determined that the absolute value of the reflected signal is greater than the threshold value (the step S203: No), the matching circuit set point calculator 140 stores the absolute value of the reflected signal after the provisional change as a value of a parameter Gamma1, for example, in a memory (not illustrated) or the like (step S205).

The matching circuit set point calculator 140 then provisionally changes the value of the variable inductor L and the value of the variable capacitor C2 to "L+ΔL" and "C2−ΔC2", respectively (step S206). In the step S206, the values after the change in the step S202 described above are not further changed, but the values are once returned to initial values before the step S206 and are then changed (and the same applies hereinafter).

The matching circuit set point calculator 140 determines whether or not the absolute value of the reflected signal after the provisional change is less than or equal to the threshold value (step S207). If it is determined that the absolute value of the reflected signal after the provisional change is less than or equal to the threshold value (the step S207: Yes), the matching circuit set point calculator 140 officially changes the value of the variable inductor L and the value of the variable capacitor C2 to "L+ΔL" and "C2−ΔC2", respectively (step S208).

If it is determined that the absolute value of the reflected signal is greater than the threshold value (the step S207: No), the matching circuit set point calculator 140 stores the absolute value of the reflected signal after the provisional change as a value of a parameter Gamma2, for example, in the memory or the like (step S209). The matching circuit set point calculator 140 then provisionally changes the value of the variable inductor L and the value of the variable capacitor C2 to "L−ΔL" and "C2+ΔC2", respectively (step S210).

The matching circuit set point calculator 140 determines whether or not the absolute value of the reflected signal after the provisional change is less than or equal to the threshold value (step S211). If it is determined that the absolute value of the reflected signal after the provisional change is less than or equal to the threshold value (the step S211: Yes), the matching circuit set point calculator 140 officially changes the value of the variable inductor L and the value of the variable capacitor C2 to "L−ΔL" and "C2+ΔC2", respectively (step S212).

If it is determined that the absolute value of the reflected signal is greater than the threshold value (the step S211: No), the matching circuit set point calculator 140 stores the absolute value of the reflected signal after the provisional change as a value of a parameter Gamma3, for example, in the memory or the like (step S213). The matching circuit set point calculator 140 then provisionally changes the value of the variable inductor L and the value of the variable capacitor C2 to "L−ΔL" and "C2−ΔC2", respectively (step S214).

The matching circuit set point calculator 140 determines whether or not the absolute value of the reflected signal after the provisional change is less than or equal to the threshold value (step S215). If it is determined that the absolute value of the reflected signal after the provisional change is less than or equal to the threshold value (the step S215: Yes), the matching circuit set point calculator 140 officially changes the value of the variable inductor L and the value of the variable capacitor C2 to "L−ΔL" and "C2−ΔC2", respectively (step S216).

If it is determined that the absolute value of the reflected signal is greater than the threshold value (the step S216: No), the matching circuit set point calculator 140 stores the absolute value of the reflected signal after the provisional change as a value of a parameter Gamma4, for example, in the memory or the like (step S217). The matching circuit set point calculator 140 then provisionally changes the value of the variable inductor L and the value of the variable capacitor C1 to "L+ΔL" and "C1+ΔC1", respectively (step S218) (refer to FIG. 7).

The matching circuit set point calculator 140 determines whether or not the absolute value of the reflected signal after the provisional change is less than or equal to the threshold value (step S219). If it is determined that the absolute value of the reflected signal after the provisional change is less than or equal to the threshold value (the step S219: Yes), the matching circuit set point calculator 140 officially changes the value of the variable inductor L and the value of the variable capacitor C1 to "L+ΔL" and "C1+ΔC1", respectively (step S220). At this time, the value of the variable capacitor C2 is not changed (i.e. still has an initial value).

If it is determined that the absolute value of the reflected signal is greater than the threshold value (the step S219: No), the matching circuit set point calculator 140 stores the absolute value of the reflected signal after the provisional change as a value of a parameter Gamma5, for example, in the memory or the like (step S221).

The matching circuit set point calculator 140 then provisionally changes the value of the variable inductor L and the value of the variable capacitor C1 to "L+ΔL" and "C1−ΔC1", respectively (step S222).

The matching circuit set point calculator 140 determines whether or not the absolute value of the reflected signal after the provisional change is less than or equal to the threshold value (step S223). If it is determined that the absolute value of the reflected signal after the provisional change is less than or equal to the threshold value (the step S223: Yes), the matching circuit set point calculator 140 officially changes the value of the variable inductor L and the value of the variable capacitor C1 to "L+ΔL" and "C1−ΔC1", respectively (step S224).

If it is determined that the absolute value of the reflected signal is greater than the threshold value (the step S223: No), the matching circuit set point calculator 140 stores the absolute value of the reflected signal after the provisional change as a value of a parameter Gamma6, for example, in the memory or the like (step S225). The matching circuit set point calculator 140 then provisionally changes the value of the variable inductor L and the value of the variable capacitor C1 to "L−ΔL" and "C1+ΔC1", respectively (step S226).

The matching circuit set point calculator 140 determines whether or not the absolute value of the reflected signal after the provisional change is less than or equal to the threshold value (step S227). If it is determined that the absolute value of the reflected signal after the provisional change is less than or equal to the threshold value (the step S227: Yes), the matching circuit set point calculator 140 officially changes the value of the variable inductor L and the value of the variable capacitor C1 to "L−ΔL" and "C1+ΔC1", respectively (step S228).

If it is determined that the absolute value of the reflected signal is greater than the threshold value (the step S227: No), the matching circuit set point calculator 140 stores the absolute value of the reflected signal after the provisional change as a value of a parameter Gamma7, for example, in the memory or the like (step S229). The matching circuit set point calculator 140 then provisionally changes the value of the variable inductor L and the value of the variable capacitor C1 to "L−ΔL" and "C−ΔC1", respectively (step S230).

The matching circuit set point calculator 140 determines whether or not the absolute value of the reflected signal after the provisional change is less than or equal to the threshold value (step S231). If it is determined that the absolute value of the reflected signal after the provisional change is less than or equal to the threshold value (the step S231: Yes), the matching circuit set point calculator 140 officially changes the value of the variable inductor L and the value of the variable capacitor C1 to "L−ΔL" and "C1−ΔC1", respectively (step S232).

If it is determined that the absolute value of the reflected signal is greater than the threshold value (the step S231: No), the matching circuit set point calculator 140 stores the absolute value of the reflected signal after the provisional change as a value of a parameter Gamma8, for example, in the memory or the like (step S233).

The matching circuit set point calculator 140 then searches for respective minimum values of the stored parameters Gamma1 to Gamma8 (step S234). The matching circuit set point calculator 140 then officially sets the value of the variable inductor L and the value of the variable capacitor C1, or the value of the variable inductor L and the value of the variable capacitor C2, which correspond to the searched minimum values (i.e. the initial values are updated) (step S235). The matching circuit set point calculator 140 then performs the step S202 described above (refer to FIG. 6).

Figure 7:
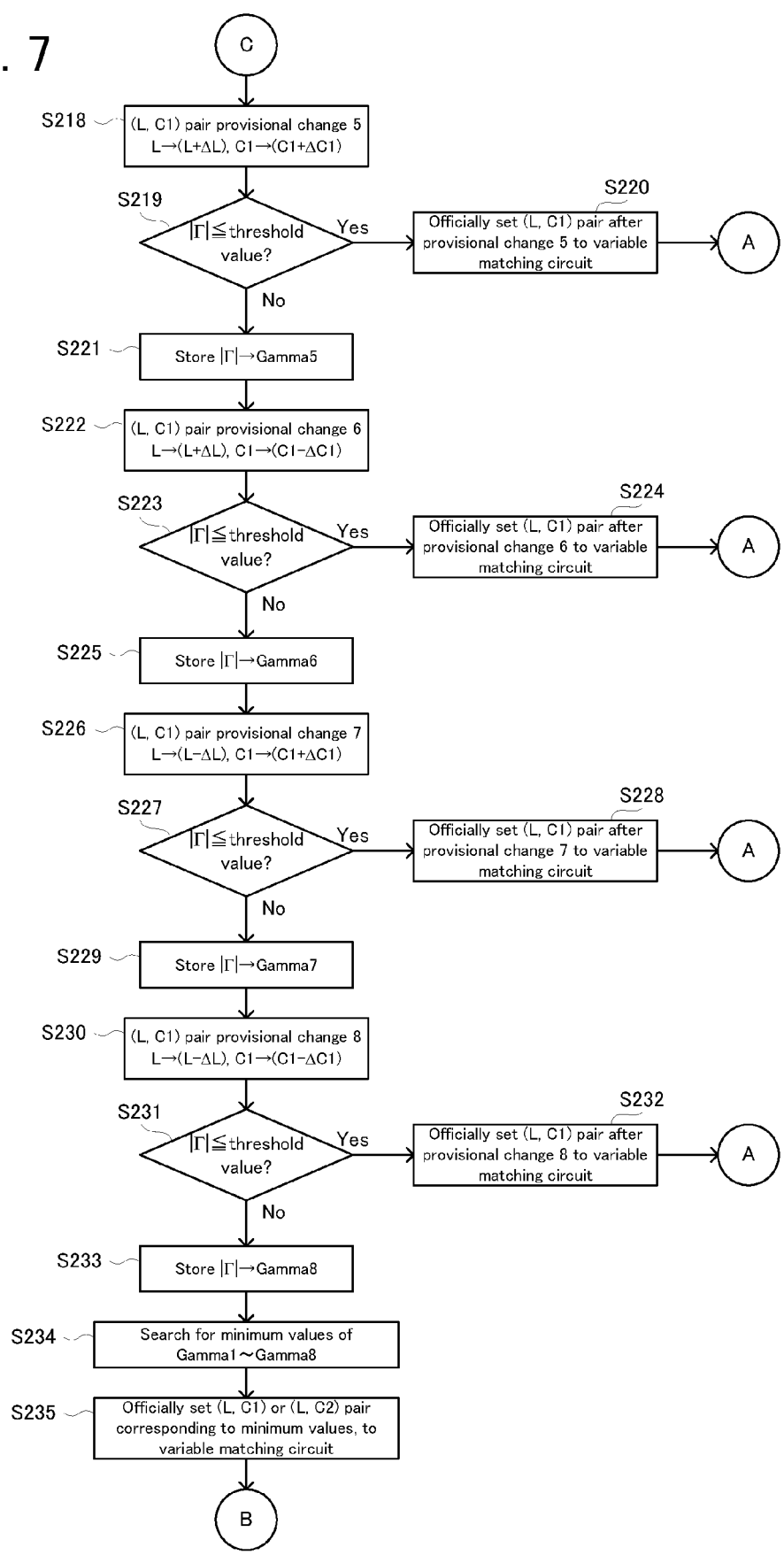
FIG. 7 is a flowchart illustrating another part of the step 2 of the impedance matching process in the first example.
Figure 8:
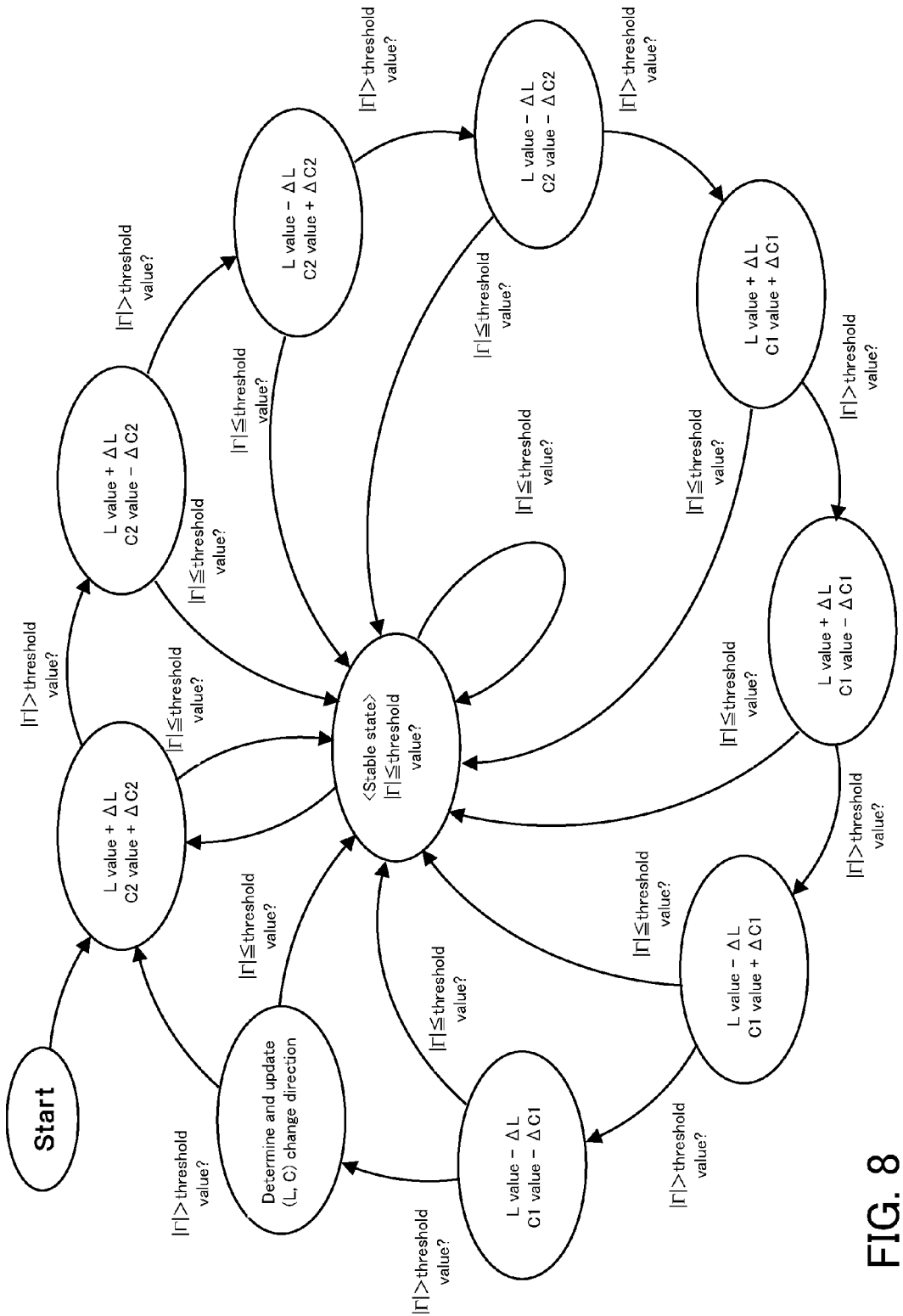
FIG. 8 is a state transition diagram illustrating the step 2 of the impedance matching process in the first example.

The flowcharts in FIG. 6 and FIG. 7 are represented as a state transition diagram in FIG. 8. FIG. 8 is a state transition diagram illustrating the step 2 of the impedance matching process in the first example.

Effect

Figure 9:
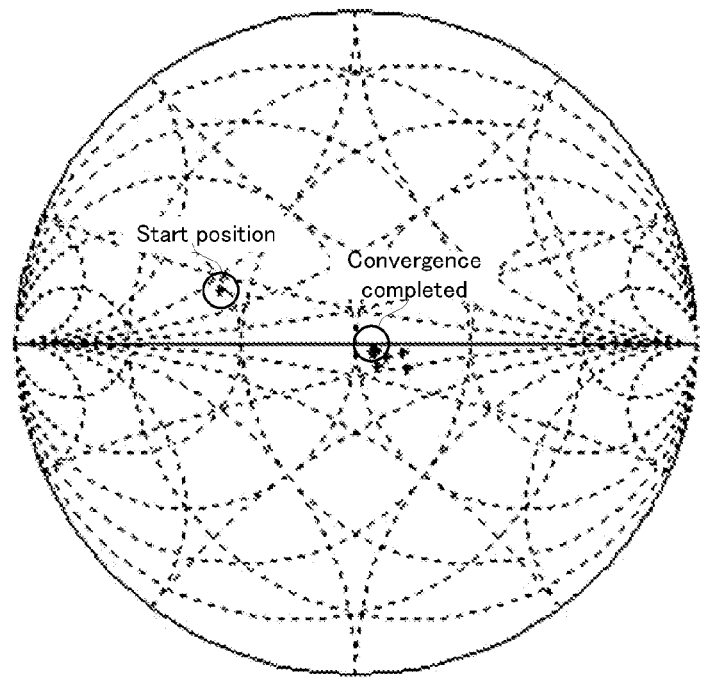
FIG. 9 is a diagram illustrating one example of a result of the impedance matching process in the first example.
Figure 10:
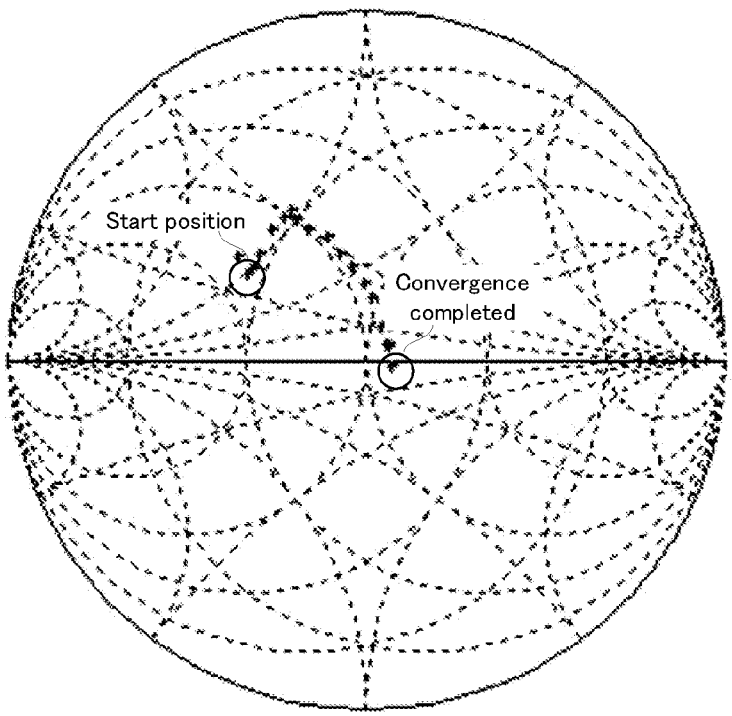
FIG. 10 is a diagram illustrating one example of a result of impedance matching process in a comparative example.
Figure 11:
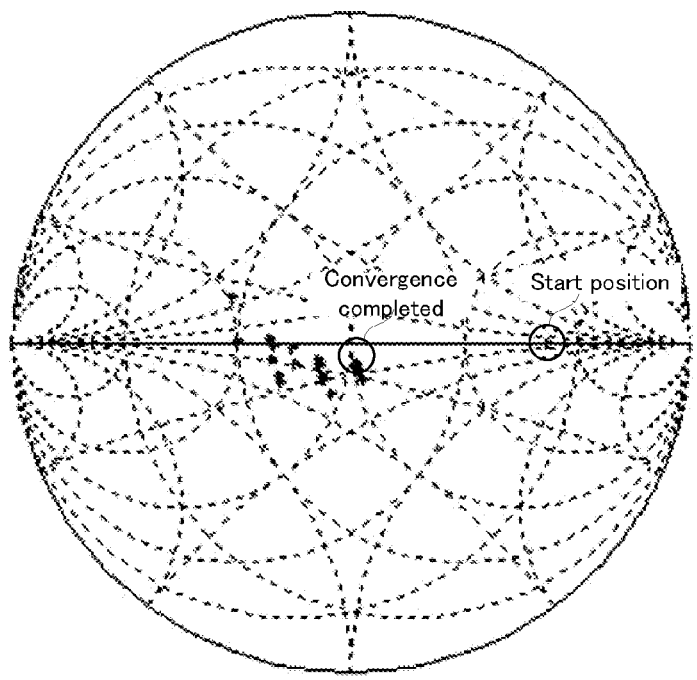
FIG. 11 is a diagram illustrating another example of the result of the impedance matching process in the first example.
Figure 12:
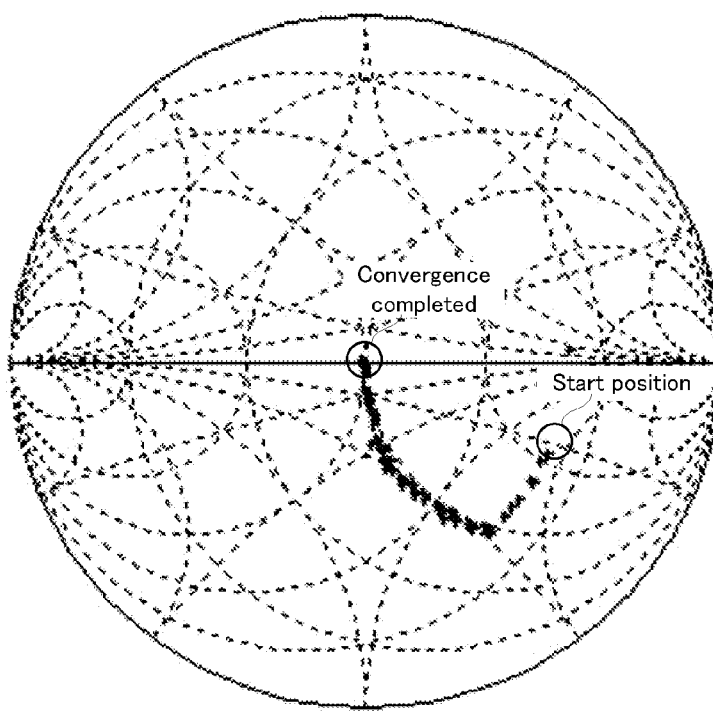
FIG. 12 is a diagram illustrating another example of the result of impedance matching process in the comparative example.

Next, an effect of the impedance matching process in the example will be explained with reference to FIG. 9 to FIG. 12. FIG. 9 is a diagram illustrating one example of a result of the impedance matching process in the first example. FIG. 10 is a diagram illustrating one example of a result of impedance matching process in a comparative example. FIG. 11 is a diagram illustrating another example of the result of the impedance matching process in the first example. FIG. 12 is a diagram illustrating another example of the result of impedance matching process in the comparative example.

Examples illustrated in FIG. 9 and FIG. 10 are those in a case where the initial value of the input impedance of the transmitting antenna 11 is 22Ω (i.e. in a case where the impedance point Zin corresponding to the initial value of the input impedance is in the region B on the Smith chart (refer to FIG. 5)). In this case, in the step 1 of the impedance matching process in the example, the theoretical value of the variable inductor L and the theoretical value of the variable capacitor C2 are calculated.

As illustrated in FIG. 9, due to the impedance matching process in the example, the matching of the impedance associated with the transmission circuit 10 requires 1.0 sec. On the other hand, as illustrated in FIG. 10, due to the impedance matching process in the comparative example, the matching of the impedance associated with the transmission circuit 10 requires 3.2 sec. As described above, the impedance matching process in the example allows the impedance matching which requires about one third the time of the impedance matching process in the comparative example.

Examples illustrated in FIG. 11 and FIG. 12 are those in a case where the initial value of the input impedance of the transmitting antenna 11 is 22Ω (i.e. in a case where the impedance point Zin corresponding to the initial value of the input impedance is in the region A on the Smith chart (refer to FIG. 4)). In this case, in the step 1 of the impedance matching process in the example, the theoretical value of the variable inductor L and the theoretical value of the variable capacitor C1 are calculated.

As illustrated in FIG. 11, due to the impedance matching process in the example, the matching of the impedance associated with the transmission circuit 10 requires 3.4 sec. On the other hand, as illustrated in FIG. 12, due to the impedance matching process in the comparative example, the matching of the impedance associated with the transmission circuit 10 requires 7.8 sec. As described above, the impedance matching process in the example allows the impedance matching which requires about half the time of the impedance matching process in the comparative example.

In the explanation regarding the step 2 of the impedance matching process of the example described above, "|Γ|" is the "absolute value of the reflected signal". If the complex reflection coefficient is used instead of the reflected signal, the "absolute value of the reflected signal" may be read as the "absolute value of the complex reflection coefficient".

Second Example

A second example of the impedance matching apparatus of the present invention will be explained on the basis of FIG. 13. The second example is the same as the first example described above, except for having a partially different impedance matching process. Thus, a repetitive explanation will be omitted as occasion demands, and basically, a point different from the first example will be explained on the basis of FIG. 13.

(Impedance Matching Process)

The step 2 of the impedance matching process in the second example will be explained with reference to a flowchart in FIG. 13. In the example, impedance matching using a steepest descent method is performed. Since the step 1 of the impedance matching process is the same as the step 1 of the impedance matching process in the first example described above, an explanation thereof will be omitted.

Figure 13:
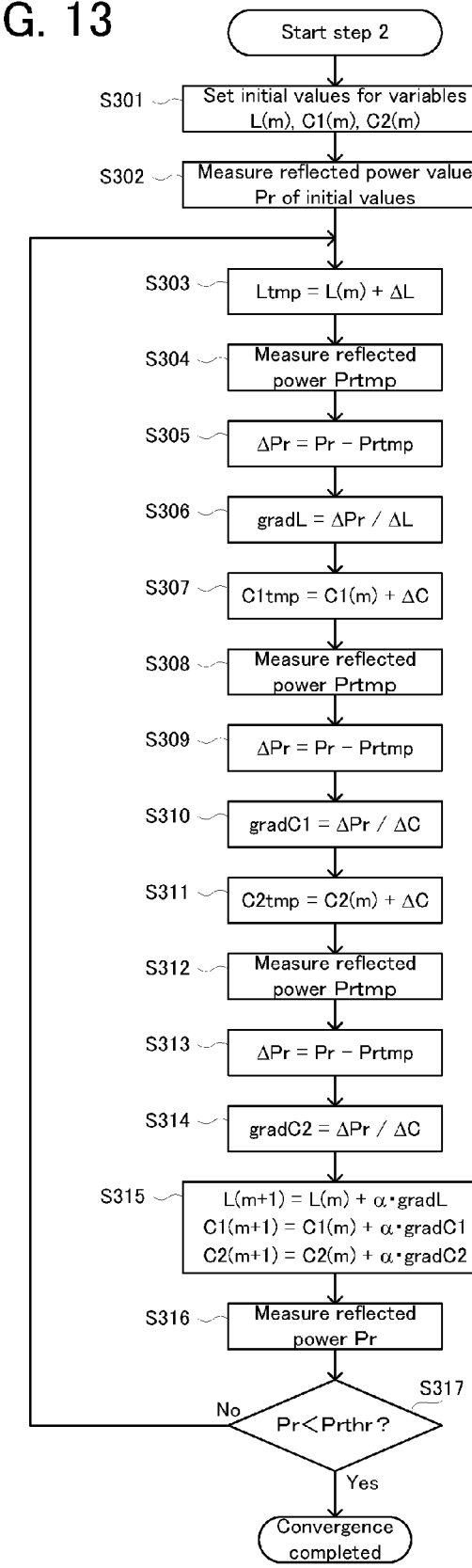
FIG. 13 is a flowchart illustrating a step 2 of an impedance matching process in a second example.

In FIG. 13, firstly, the matching circuit set point calculator 140 sets respective initial values for variables L(m), C1(m) and C2(m) which correspond to the variable inductor L, the variable capacitor C1 and the variable capacitor C2, respectively (step S301). The respective initial values for the variables L(m), C1(m) and C2(m) are values obtained as a result of the step 1 of the impedance matching process.

The matching circuit set point calculator 140 then sets respective values of the variable inductor L, the variable capacitor C1 and the variable capacitor C2 so as to correspond to the respective initial values for the variables L(m), C1(m) and C2(m), and then obtains a reflected power value Pr on the basis of the reflected signal extracted by the directional coupler 120 (step S302). The reflected power value Pr is obtained as a product of the square of the absolute value of the reflected signal and an incident power value Pin (i.e. $Pr=|Γ|^2 \times Pin$).

The matching circuit set point calculator 140 then changes the value of the variable inductor L to Ltmp (=L(m)+ΔL) (step S303). At this time, the values of the variable capacitors C1 and C2 are not changed (i.e. still have the respective initial values).

The matching circuit set point calculator 140 obtains a reflected power value Prtmp on the basis of the reflected signal extracted by the direction coupler 120 after changing the value of the variable inductor L (step S304). The matching circuit set point calculator 140 then calculates a difference ΔPr between the reflected power value Pr and the reflected power value Prtmp (step S305). The matching circuit set point calculator 140 then calculates a gradient gradL (=ΔPr/ΔL) (step S306).

The matching circuit set point calculator 140 then changes the value of the variable capacitor C1 to C1tmp (=C1(m)+ΔC) (step S307). At this time, the values of the variable inductor L and the variable capacitor C2 are not changed (i.e. still have the respective initial values).

The matching circuit set point calculator 140 obtains the reflected power value Prtmp on the basis of the reflected signal extracted by the direction coupler 120 after changing the value of the variable capacitor C1 (step S308). The matching circuit set point calculator 140 then calculates the difference ΔPr between the reflected power value Pr and the reflected power value Prtmp (step S309). The matching circuit set point calculator 140 then calculates a gradient gradC1 (=ΔPr/ΔC) (step S310).

The matching circuit set point calculator 140 then changes the value of the variable capacitor C2 to C2tmp (=C2(m)+ΔC) (step S311). At this time, the values of the variable inductor L and the variable capacitor C1 are not changed (i.e. still have the respective initial values).

The matching circuit set point calculator 140 obtains the reflected power value Prtmp on the basis of the reflected signal extracted by the direction coupler 120 after changing the value of the variable capacitor C2 (step S312). The matching circuit set point calculator 140 then calculates the difference ΔPr between the reflected power value Pr and the reflected power value Prtmp (step S313). The matching circuit set point calculator 140 then calculates a gradient gradC2 (=ΔPr/ΔC) (step S314).

The matching circuit set point calculator 140 then obtains each of new variables L(m+1) (=variable L(m)+α·gradL), C1(m+1) (=variable C1(m)+α·gradC1), and (m+1) C2(m+1) (=variable C2(m)+α·gradC2) which correspond to the variable inductor L, the variable capacitor C1 and the variable capacitor C2 (step S315), respectively, wherein "α" is a predetermined proportionality constant.

The matching circuit set point calculator 140 then sets respective values of the variable inductor L, the variable capacitor C1 and the variable capacitor C2 so as to correspond to the respective variables L(m+1), C1(m+1) and C2(m+1), and then obtains the reflected power value Pr on the basis of the reflected signal extracted by the directional coupler 120 (step S316).

The matching circuit set point calculator 140 then determines whether or not the obtained reflected power value Pr is less than a threshold value Prthr (step S317). If it is determined that the obtained reflected power value Pr is less than the threshold value Prthr (the step S317: Yes), the matching circuit set point calculator 140 ends the process. On the other hand, if it is determined that the obtained reflected power value Pr is greater than or equal to the threshold value Prthr (the step S317: No), the matching circuit set point calculator 140 performs the step S303 described above.

The present invention is not limited to wireless power transmission exemplified in the examples but can be applied to, for example, communication.

The present invention is not limited to the aforementioned embodiments and examples, but various changes may be made, if desired, without departing from the essence or spirit of the invention which can be read from the claims and the entire specification. An impedance matching apparatus and method, and a computer program which involve such changes are also intended to be within the technical scope of the present invention.

DESCRIPTION OF REFERENCE NUMERALS

10 transmission circuit
11 transmitting antenna
12 transmission-side circuit part
13 amplifier
14 transmission signal source
20 reception circuit
21 receiving antenna
22 reception-side circuit part
23 rectifier circuit
24 loading apparatus
100 impedance matching apparatus
110 variable matching circuit
120 directional coupler
130 input impedance estimator
140 matching circuit set point calculator

The invention claimed is:

1. An impedance matching apparatus configured to perform impedance matching between input impedance of a transmitting antenna and output impedance of a power supply configured to supply electric power to the transmitting antenna, said impedance matching apparatus comprising:
a matching circuit electrically disposed between the power supply and the transmitting antenna and having a plurality of variable reactance elements;
an incident signal/reflected signal extracting circuit electrically disposed between the power supply and said matching circuit, and configured to extract an incident signal, which is electric power transmitted from the power supply to the transmitting antenna, and a reflected signal, which is electric power transmitted from the transmitting antenna to the power supply;
an estimating device configured to estimate the input impedance on the basis of the extracted incident signal and the extracted reflected signal; and
a setting device configured to perform (i) a first step of calculating a theoretical value associated with one part of the plurality of variable reactance elements such that the output impedance theoretically matches the input impedance on the basis of the estimated input impedance, and of setting a value associated with one part of the plurality of variable reactance elements such that the value becomes the calculated theoretical value, and (ii) a second step of changing a value associated with at least one of the plurality of variable reactance elements in a condition that an absolute value of the reflected signal extracted by said incident signal/reflected signal extracting circuit after the first step is greater than a first threshold value, of comparing the absolute value of the reflected signal extracted by said incident signal/reflected signal extracting circuit after changing the value associated with at least one of the plurality of variable reactance elements, and of setting a current value associated with one part of the plurality of variable reactance elements as an official value if the compared absolute value is less than or equal to the first threshold value.

2. The impedance matching apparatus according to claim 1, wherein
said matching circuit has, as the plurality of variable reactance elements, a variable inductor, a first variable capacitor electrically connected to one end of the variable inductor and a second variable capacitor electrically connected to the other end of the variable inductor, and
said setting device, in the first step, calculates, as the value associated with one part of the plurality of variable reactance elements, a theoretical value of each of a value associated with the variable inductor, and a value associated with the first variable capacitor or the second variable capacitor such that the output impedance theoretically matches the input impedance, on the basis of the estimated input impedance, and sets the value associated with the variable inductor, and the value associated with the first variable capacitor or the second variable capacitor such that each of values becomes the calculated theoretical value.

3. The impedance matching apparatus according to claim 1, wherein said setting device stores the absolute value of the reflected signal extracted by said incident signal/reflected signal extracting circuit in relation to the value associated with one part of the plurality of variable reactance elements each time said setting device changes the value associated with at least one of the plurality of variable reactance elements in the second step, and sets the value associated with one part of the plurality of variable reactance elements in relation to the absolute value of the reflected signal, which is a minimum absolute value of stored absolute values, as the official value if in the second step, the compared absolute value is greater than the first threshold value though the absolute value of the reflected signal extracted by said incident signal/reflected signal extracting circuit is compared the first threshold value predetermined number of times.

4. The impedance matching apparatus according to claim 3, wherein said setting device performs the second step again if the absolute value of the reflected signal extracted by said incident signal/reflected signal extracting circuit is greater than the first threshold value after setting the official value in the second step.

5. The impedance matching apparatus according to claim 1, wherein
said estimating device sequentially estimates a reflection coefficient on the basis of the extracted incident signal and the extracted reflected signal, and
said setting device adjusts the value associated with at least one of the plurality of variable reactance elements until a magnitude of the estimated reflection coefficient becomes less than or equal to a second threshold value, instead of the extracted reflected signal after the first step instead of the second step.

6. The impedance matching apparatus according to claim 5, wherein if the magnitude of the extracted reflection coefficient becomes less than or equal to the second threshold value and then becomes greater than the second threshold value, said setting device adjusts the value associated with at least one of the plurality of variable reactance elements until the magnitude of the extracted reflection coefficient becomes less than or equal to the second threshold value again.

7. The impedance matching apparatus according to claim 1, wherein
said impedance matching apparatus is comprised in the transmission circuit which is a circuit configured to transmit electric power in a wireless manner to a reception circuit which comprises a receiving antenna, and
said setting device performs the first step and the second step when the electric power, which is weaker than performing electric power transmission at normal rated power, is transmitted from the transmission antenna to the reception antenna.

8. An impedance matching method of performing impedance matching between input impedance of a transmitting antenna and output impedance of a power supply, on an impedance matching apparatus comprising: the transmitting antenna; the power supply configured to supply electric power to the transmitting antenna; a matching circuit electrically disposed between the power supply and the transmitting antenna and having a plurality of variable reactance elements; and an incident signal/reflected signal extracting circuit electrically disposed between the power supply and said matching circuit, and configured to extract an incident signal, which is electric power transmitted from the power supply to the transmitting antenna, and a reflected signal, which is electric power transmitted from the transmitting antenna to the power supply,
said impedance matching method comprising:
an estimating process of estimating the input impedance on the basis of the extracted incident signal and the extracted reflected signal; and
a setting process of performing (i) a first step of calculating a theoretical value associated with one part of the plurality of variable reactance elements such that the output impedance theoretically matches the input impedance on the basis of the estimated input impedance, and of setting a value associated with one part of the plurality of variable reactance elements such that the value becomes the calculated theoretical value, and (ii) a second step of changing a value associated with at least one of the plurality of variable reactance elements in a condition that an absolute value of the reflected signal extracted by said incident signal/reflected signal extracting circuit after the first step is greater than a first threshold value, of comparing the absolute value of the reflected signal extracted by said incident signal/reflected signal extracting circuit after changing the value associated with at least one of the plurality of variable reactance elements, and of setting a current value associated with one part of the plurality of variable reactance elements as an official value if the compared absolute value is less than or equal to the first threshold value.

9. A non-transitory tangible computer readable medium containing a computer program configured to make a computer provided in an impedance matching apparatus function as an estimating device and a setting device, said impedance matching apparatus comprising: a transmitting antenna; a power supply configured to supply electric power to the transmitting antenna; a matching circuit electrically disposed between the power supply and the transmitting antenna and having a plurality of variable reactance elements; and an incident signal/reflected signal extracting circuit electrically disposed between the power supply and said matching circuit, and configured to extract an incident signal, which is electric power transmitted from the power supply to the transmitting antenna, and a reflected signal, which is electric power transmitted from the transmitting antenna to the power supply,
said estimating device being configured to estimate the input impedance on the basis of the extracted incident signal and the extracted reflected signal, and
said setting device being configured to perform (i) a first step of calculating a theoretical value associated with one part of the plurality of variable reactance elements such that the output impedance theoretically matches the input impedance on the basis of the estimated input impedance, and of setting a value associated with one part of the plurality of variable reactance elements such that the value becomes the calculated theoretical value, and (ii) a second step of changing a value associated with at least one of the plurality of variable reactance elements in a condition that an absolute value of the reflected signal extracted by said incident signal/reflected signal extracting circuit after the first step is greater than a first threshold value, of comparing the absolute value of the reflected signal extracted by said incident signal/reflected signal extracting circuit after changing the value associated with at least one of the plurality of variable reactance elements, and of setting a current value associated with one part of the plurality of variable reactance elements as an official value if the compared absolute value is less than or equal to the first threshold value.

* * * * *